United States Patent [19]
Furman

[11] Patent Number: 4,554,645
[45] Date of Patent: Nov. 19, 1985

[54] MULTI-PORT REGISTER IMPLEMENTATION

[75] Inventor: Anatol Furman, Jericho, Vt.

[73] Assignee: International Business Machines Corporation, Armonk, N.Y.

[21] Appl. No.: 473,927

[22] Filed: Mar. 10, 1983

[51] Int. Cl.[4] .............................................. G11C 11/40
[52] U.S. Cl. ..................... 365/189; 365/174
[58] Field of Search ............... 365/189, 230, 239, 174, 365/149, 238

[56] References Cited

U.S. PATENT DOCUMENTS

| | | | |
|---|---|---|---|
| 3,585,613 | 6/1971 | Palfi | 365/149 |
| 3,636,528 | 1/1972 | Morris | 365/190 |
| 3,979,735 | 9/1976 | Payne | 365/190 |
| 4,122,547 | 10/1978 | Schroeder et al. | 365/189 |
| 4,125,877 | 11/1978 | Reinert | 365/190 |
| 4,193,127 | 3/1980 | Gersbach | 365/174 |
| 4,280,197 | 7/1981 | Schlig | 365/154 |
| 4,287,575 | 9/1981 | Eardley et al. | 365/174 |
| 4,321,492 | 3/1982 | Hollingsworth | 307/530 |

OTHER PUBLICATIONS

Electronics Design News, May 1, 1970, "Dynamic MOS", pp. 20, 21.

*Primary Examiner*—Joseph A. Popek
*Attorney, Agent, or Firm*—Francis J. Thornton

[57] ABSTRACT

The present invention is especially directed toward a memory cell designed for use in a register stack in which multiple independent and parallel read/write and read operations may proceed simultaneously. The cell comprises multiple write transistors and multiple read transistors all coupled to a single dynamic storage means which can be written into and read from, simultaneously.

5 Claims, 2 Drawing Figures

MULTI-PORT REGISTER IMPLEMENTATION

FIELD OF THE INVENTION

This invention relates to a random access read/write memory system and more particularly to a unique memory cell especially for use in a register stack in which independent and parallel write and read operations may proceed simultaneously: these writes and reads operating from separately independent addresses can occur simultaneously, i.e., two registers in a stack may be read in parallel and simultaneously. This particular limitation provides a very significant performance increase over the previous implementations at little or no size penalty.

BACKGROUND OF THE INVENTION

In selected microprocessors, some of which require high speed registers at local storage, it would be desirable if each register can be separately addressable from the multiplicity of data-in ports for writes and separately addressable to a multiplicity of data-out ports for reads. The data in the register thus would be writable from any data-in port and readable at any data-out port. Such multiport devices might comprise three bit memory configurations arranged with independent read and write addressing so that upon a write the identical information is written into each configuration and the identical address position and then sequential writes will write into the different port addresses in parallel so that each of the three configurations contain the same information and the same address positions. Then a simultaneous read of the three configurations in three different positions with three different addresses-will present three different output words to each of the three different output ports.

Because of reasons which have to do with circuit size, cell ability, wiring density and functional reliability, and performance, present cell arrangements as described in the prior art are not considered applicable. Also they are not readily extendable to multiport configurations greater than three or four ports. For example, as a result of direct design efforts it has been determined that a three port six device cell using read and write memory circuits is almost twice as large as a similarly designed two port differential read and write circuit and that an extension to a five port circuit is totally unreasonable on the basis of size. In addition, the six, i.e., three pairs of differential lines of bit line wires per three port cell becomes ten, i.e., five pairs of differential lines per cell, and this creates significant wireability problems. Thus, such multiport circuits have generally been avoided.

Until the present invention there has been no satisfactory simple cells that can be easily extended to any size multiport configurations as needed nor has such a configuration been developed that will permit simultaneous read and write activities that avoids the time multiplexing of sequential timing schemes of the prior art.

BACKGROUND ART

In U.S. Pat. No. 3,585,613 there is disclosed a three device cell in which sequential read and write operations occur. This cell provides for only a single read or write and does not accommodate itself as a multiple independent in parallel write and read operations.

U.S. Pat. No. 3,636,528 also teaches a three device cell employing sequential read and write operations similar to that shown in U.S. Pat. No. 3,585,613.

SUMMARY OF THE INVENTION

The present invention is especially directed toward a memory cell designed for use in a register stack in which multiple independent and parallel read/write and read operations may proceed simultaneously. The cell comprises multiple write transistors and multiple read transistors all coupled to a single dynamic storage means which can be written into and read from, simultaneously.

From the foregoing it can be seen that an object of the present invention is to provide an improved dynamic memory cell.

Another object of the present invention is to provide a dynamic cell especially useful for register stacks and logic applications.

Still another object of the present invention is to provide a memory system which results in reduced wiring density and better performance with no size penalty.

A further object of the present invention is to provide multiple reads from a multiport register cell while simultaneously writing that information from independent write ports.

A still further object of the invention is to provide a cell which can be readily implemented in a bit slice configuration and which is expandable to any reasonable number of read and write ports.

These and other objects of the present invention will become more apparent when taken in conjunction with the following descriptions and drawings wherein there is set forth a specific embodiment of the present invention.

DESCRIPTION OF THE PREFERRED EMBODIMENT

A multiport register stack is intrinsic to selective microporcessors some of which requires 16 high bit registers as local storage. Each register is required to be at least 32 bit long and maybe even longer if parity is required for the 32 bit processor. Thus, it is convenient to consider the register stack as a 512 bit static memory with 16 bits of 32 bits each where every read or write is a 32 bit wide word.

The term multiport as used herein refers to the requirement that each register must be separately addressable from a multiplicity of data-in write ports and separately addressable to a multiplicity of data-out read ports. The term port refers to the number of ways that a given register or bit of a register may be addressed such that any data in any register must be available from any port.

It is more clearly demonstrated in the action of a multiport register stack if you consider the following implementation of a multiport register stack which requires three reads. Three single port 512 bit memories with independent read and write addressing are arranged so that on a write the identical information is written into each memory in the identical address position then, three sequential writes will write the same information into each memory into different port addresses in parallel so that each of the three memories contains the same information in the same three address positions. Finally, the simultaneous read of the three memories in three different addresses will present three different words to each of the three different output ports.

Figure 1:
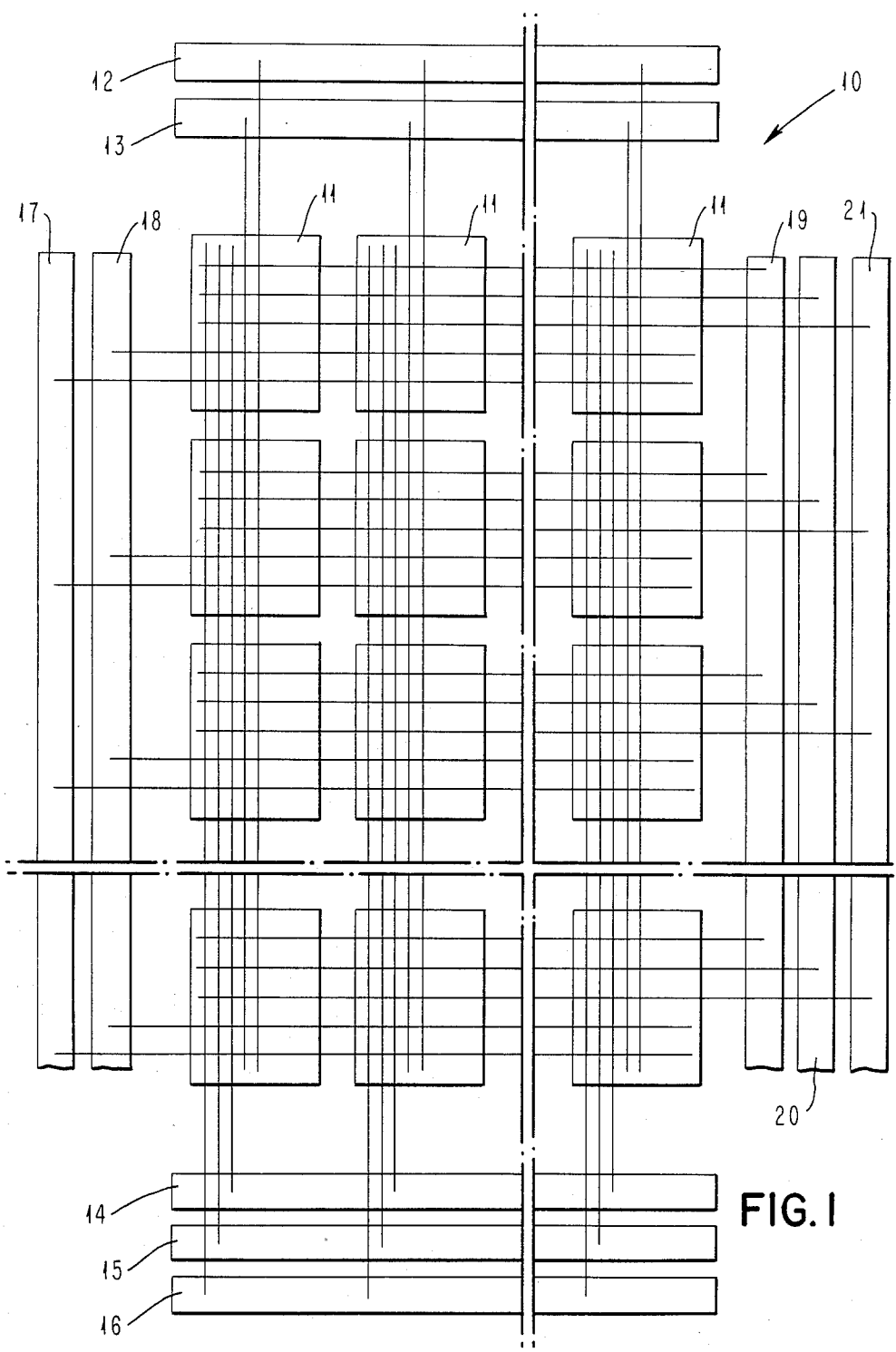
FIG. 1 illustrates in schematic form a complete array of a system which can profitably employ the present invention.
Figure 2:
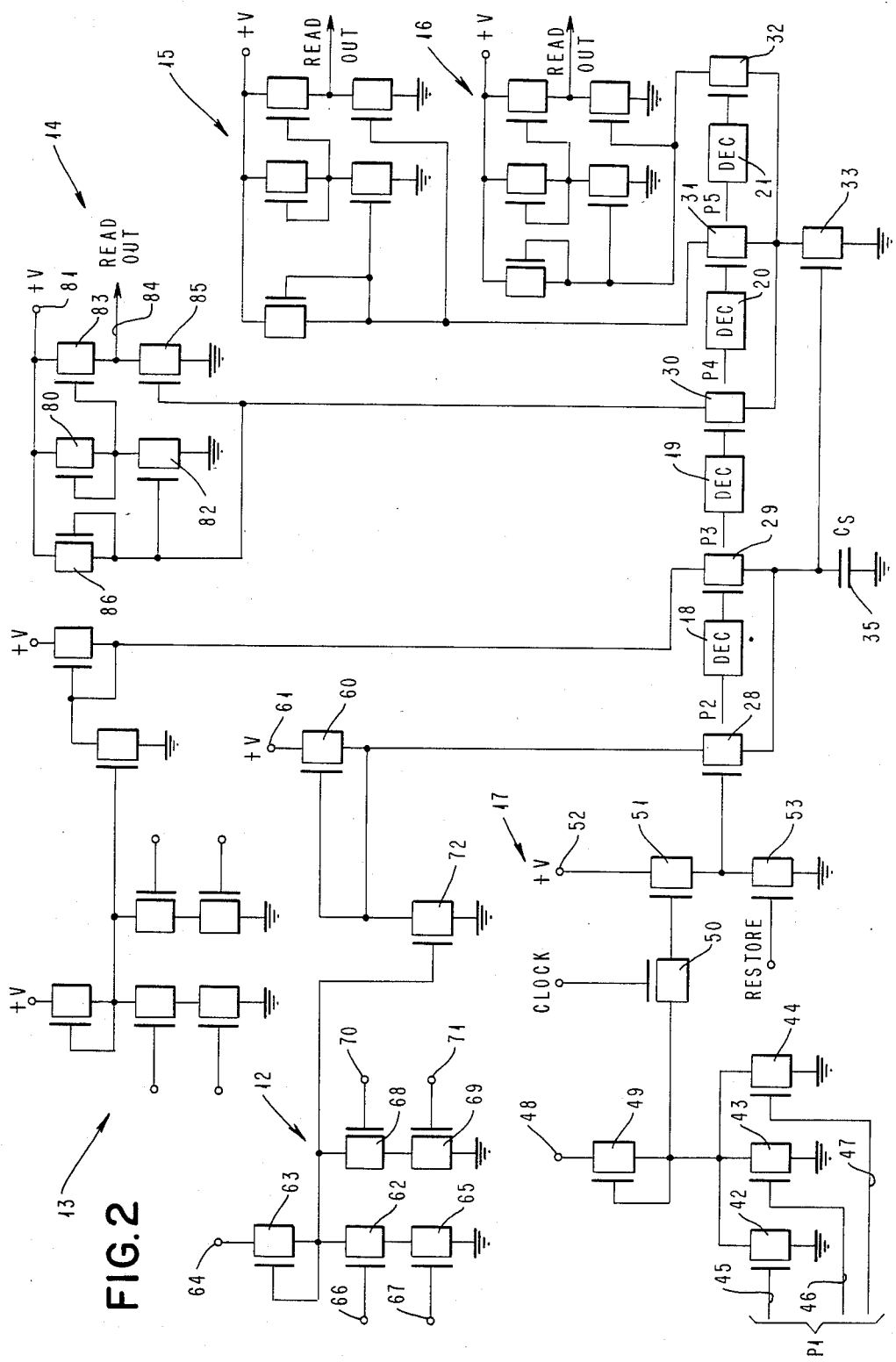
FIG. 2 illustrates one of the cells of the array of FIG. 1 together with detailed, decode read and write circuits.

The present implementation is especially exemplified in FIGS. 1 and 2. Referring now to FIG. 1 of the drawing there is shown a block diagram of a multiport memory system employing the present invention.

The system has an array 10 of memory or storage cells 11 each cell of which is coupled to a set of write heads, a set of read heads and a set of decoders. The set of write heads and the set of read heads together equal the number of ports in the system and the number of necessary decoders needed. For purposes of example only a five port system will be described. In this case each cell is coupled to two write heads 12 and 13, three read heads 14, 15, and 16 and five decoders, 2 write decoders, 17 and 18, and three read decoders, 19, 20, and 21. The decoders 17, 18, 19, 20, and 21 are all driven by respective input address lines. Thus, FIG. 1 shows unit cells 11, each one bit of a five port, three read and two write port, system. If the cell 11 is replicated 32 times horizontally (only three are shown in the figure), it represents one word of the register stack; replicated 16 times vertically (only four are shown in the figure), the cell represents one bit of the register stack.

As shown in FIG. 2 the bit line transistors, 28, 29, 30, 31, and 32, amplifier transistor 33, and storage capacitor 35, together constitute the memory cell. Transistors 28 and 29 are write bit line transistors and couple write heads 12 and 13 to the storage capacitor 35. Transistors 30, 31, and 32 are read bit line transistors and couple the transistor 33 to the read heads 14, 15, and 16. Each bit line transistor 28, 29, 30, 31, and 32 in the cell is selected by a respective one of the decoders 17, 18, 19, 20 or 21.

To sink all the current that the read bit line transistors 30, 31, and 32 can deliver transistor 33 must be large, i.e. about ten times larger than these read bit line transistors 30, 31 and 32.

The cell comprises an amplifier transistor 33 having its source coupled to ground and its drain coupled through the respective bit line transistors 30, 31, and 32 to the respective read heads 14, 15, and 16. The gates of the transistors 30, 31, and 32 are coupled to respective read decoders 19, 20, and 21. The gate of transistor 33 is coupled through the storage capacitor to ground and through write bit line transistors 28 and 29 to respective write heads 12 and 13. The gates of transistors 28 and 29 are connected to write decoders 17 and 18.

As noted, the gates of transistors 28, 29, 30, 31, and 32 are coupled to a respective one of the word decoders 17, 18, 19, 20, and 21. These decoders, of which only 17 is shown in detail, are identical. Each decoder is comprised of a plurality of input decode transistors each of which has its gate coupled to a respective address line. In this case it will be presumed, for purposes of explanation only, that three addresses are employed. Thus, decoder 17 is shown as having three input decode transistors 42, 43, and 44, each of which has its gate coupled to a respective address line 45, 46, and 47, which will be collectively referred to as address P1. The sources of the input transistors 42, 43, and 44 are coupled to ground and their drains are coupled to a voltage source 48 through a load transistor 49 and are also coupled through a clock gated transistor 50 to the gate of a switching transistor 51 whose drain is coupled to a voltage source 52 and whose source is coupled to the gate of the bit line transistor 28 and through a restore gated transistor 53 at ground.

It should of course be understood that if more than three addresses are required or used in the system then additional input decode transistors equal to the number of input address lines would be used in such decoders.

Such word decoders generally operate as follows. If any one or all of the address lines 45, 46, and 47 has a high positive signal thereon, say address line 45 is high, the transistor gated by the address line, in this case the device 42, is on causing the source of the clocked gated transistor 50 to be pulled towards ground. The clock is also high, and the gate of transistor 51 is also grounded. Thus, the gate of transistor 51 is turned off anytime the clock is high and one of the decode devices 42, 43, or 44 is on. When the device 51 is off the bit line transistor 28 is also off. When all of the input addresses, lines 45, 46, and 47 are negative and the clock is positive the device 51 is on and the bit line transistor 28 is also on since its gate is now coupled through transistor 51 to the voltage source 52.

When the bit line transistor 28 is on information can be written into the cell, i.e., the state of the storage capacitor 35 can be modified by the write head 12. The other decoders in the system, namely decoders 18, 19, 20, and 21 are identical to the decoder 17 and operate in an identical fashion except that each such decoder has a different set of input address lines. For the sake of convenience the input address lines 45, 46, and 47 to decoder 17 will be collectively referred to as address set P1. The input decode address lines to the decoder 18 will be collectively referred to as address set P2. The input address lines to the decoder 19 will be collectively referred to as address set P3. The input address lines to decode 20 will be collectively referred to as address set P4 and the input address lines to the decoder 21 will collectively be referred to as the address set P5.

A description of the write head 12 will now be given. We now assume, for example, that the bit line connector 28 has been turned on and that capacitor 35 is discharged. The write head 12 comprises a data-in transistor 62 whose drain is coupled, through a load transistor 63, to a voltage source 64 and whose source is connected to the drain of a write transistor 65. The source of the write transistor 65 is coupled to ground. The gate of the data-in transistor 62 is coupled to a suitable data source 66 while the gate of the write transistor 65 is coupled to a suitable write source 67. A pair of serially arranged refresh transistors 68 and 69 are coupled between the load transistor 63 and ground. Their gates are coupled to respective refresh drivers 70 and 71. The drains of transistors 62 and 68 are joined together and to the gate of a switching transistor 72 whose source is grounded and whose drain is coupled to a voltage source 61, through a load transistor 60 and also is coupled to the drain of bit line transistor 28.

This write head operates as follows. When a zero is to be written into the cell, i.e., the capacitor 35 is discharged and the addresses to decoder 17 are all negative causing device 28 to turn on as described above. When device 28 turns on simultaneous negative signals are applied to the gates of data-in transistor 62 and write transistor 65. This leaves the gate of transistor 72 high and transistor 72 is on. This causes the source of the bit line transistor 28 to be pulled towards ground through transistor 72. This causes the capacitor 35 to be discharged, and thus a zero is written in the cell.

When a one is to be written into the cell, i.e., the storage capacitor 35 is charged, all the addresses to decoder 17 are negative causing device 28 to be turned on. When device 28 is on its drain is coupled through a load transistor 60 to a voltage source 61 causing the storage capacitor 35 to become fully charged. When storage capacitor 35 becomes charged and the gate of transistor 33 is high, transistor 33 is on coupling the sources of transistors 30, 31, and 32 to ground. In this instance the data-in and write signal sources 66 and 67 are high, causing the transistor 62 and 65 to turn on and bring the gate of transistor 72 towards ground. This turns transistor 72 off causing the source of transistor 28 to rise towards the voltage source 61. Thus, when the transistor 28 turns on the capacitor 35 is charged by the voltage source 61 and the capacitor 35 is in the one state.

The write head 13 coupled through the bit line transistor 29 operates in an identical fashion.

It should be noted that the capacitor 35 can be written, in either a one or zero state, through either one of the write bit line transistors 28 or 29. A simultaneous write from more than one port in same address must be considered a logically inconsistant operation, since the possibility of writing opposite information from separate parts must be considered. It may require "priority channel," "preferred state," or other decision making. In any event, additional "logic" is needed to decide. This would be an application dependant condition. In some systems, the *system guarantees* that no write in both ports with same address can occur.

Once the storage capacitor 35 has been written into the desired state a read operation can be commenced. It is possible to write and read in one address—in one cycle. This means that capacitor 35 will change state within the cycle, and that output data will change state within the cycle . . . This is not a sequential operation. It is really an extended simultaneous operation. A read-only might be faster, but it is essential—for certain type processors, that a write/read occur in one cycle. The read operation is performed by causing suitable address sets to be applied to one or more of the decoders 19, 20 or 21. All three of these decoders could be individually, turned on in any order, or even simultaneously. Assuming, for example, that the address set P3 to decoder 19 is negative the decoder 19 causes the transistor 30 to turn on and couple the read head 14 to the drain of transistor 33. If the storage capacitor is fully discharged the device 33 is held off and no current flows through the bit line transistor 30 and that read head 14 remains high. The read head 14 comprises a load transistor 80 having its drain coupled to a voltage source 81 and its source coupled to ground through a switching transistor 82, and to the gate of a follower transistor 83. The drain of the follower transistor 83 is connected to the voltage source 81 and its source is connected to the output read line 84 and through a transistor 85 to ground. The gate of the transistor 85 is coupled to the drain of the bit line transistor 30 and through a second load transistor 86 to voltage source 81.

When suitable addresses are applied to decoder 19, to cause the gate of bit line transistor 30 to become positive, transistor 30 turns on. If the storage capacitor 35 has sufficient charge thereon to cause capacitor 33 to become also turned on, the gates of transistors 82 and 85 are pulled towards ground causing transistors 82 and 85 to turn off. The gate of transistor 83 too remains positive through load transistor 80 and transistor 83 remains on. This causes the output read line 84 to rise towards the positive source 81, indicating that a one was stored in the cell.

When a zero is stored, i.e., the capacitor 35 is discharged, the transistor 33 does not turn on. Now even if transistor 30 turns on the bit line leading to read head 14 remains high because of the positive voltage applied through load transistor 86. This voltage holds the gates of transistors 82 and 85 high. When these devices turn on the output read line 84 is pulled towards ground through transistor 85 indicating that a zero was retained within the storage capacitor 35.

The other read heads, 15 and 16 are substantially identical and operate in an absolutely identical manner. It should be noted that all three decoders 19, 20, and 21 could all rise simultaneously and simultaneously cause the information contained within the storage capacitor 35 to be read by each read head 14, 15, and 16.

When the address sets P3, P4, and P5 are all identical then each of the bit line transistors 30, 31, and 32 turn on causing each of the read heads 14, 15, and 16 to read the identical information contained within the storage capacitor 35.

It should be noted that although write decoders 17 and 18 could turn on at the same time such is not desirable and should be avoided unless identical data is to be written into the storage cell and in such a case no advantage would be derived. However, by utilizing the different decoders and different write heads different information can be written into the capacitor storage cell 35.

It should, of course, be obvious to one skilled in the art that the present cell can be extended beyound the two write lines and three read lines provided in the described preferred embodiment and that the technique described herein can be extended to any size array and that for more output ports or input ports more write heads, decoders and read heads would be required.

Thus, there has been described a unique multiport cell for providing multiple reads in multiport register arrays which greatly reduces array size and improves performance.

While the invention has been particularly described with reference to the preferred embodiments thereof, it will be understood by those skilled in the art that changes in form and details can be made in the foregoing described embodiments without departing from the spirit and scope of the invention.

What is claimed is:

1. A dynamic memory cell that can be concurrently written and read or sequentially written and read comprising:
   a write bit line transistor having its drain coupled to a first write bit line, its gate coupled to a first write word line and its source coupled to a storage means and an amplifier,
   said amplifier comprising a transistor whose source is grounded, whose gate is connected to the storage means and whose drain is coupled through first and second read bit line transistors to respective first and second read bit lines, the gates of the read bit line transistors being coupled to respective first and second read word lines.

2. The cell of claim 1 wherein said storage means comprises a capacitor.

3. The cell of claim 2 wherein said cell further includes a second write bit line transistor having its drain coupled to a second write bit line, its gate coupled to a second write word line and its source coupled to said storage means and said amplifier.

4. A memory system comprising a multiport memory cell having first and second write bit line transistors coupled between respective write bit lines and a storage means, and first and second read bit line transistors coupled between respective read bit lines and an amplifier transistor driven by said storage means.

5. The system of claim 4 wherein each of said bit line transistors is driven by an address line decoder circuit, each write bit line is coupled to a respective write head and each read bit line is coupled to a respective read head.

* * * * *